(12) United States Patent
Ma et al.

(10) Patent No.: US 11,385,506 B2
(45) Date of Patent: Jul. 12, 2022

(54) DISPLAY SUBSTRATE AND MANUFACTURING METHOD THEREOF AND DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Tao Ma, Beijing (CN); Biao Luo, Beijing (CN); Wei He, Beijing (CN); Chengshao Yang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 93 days.

(21) Appl. No.: 16/650,092

(22) PCT Filed: Sep. 12, 2019

(86) PCT No.: PCT/CN2019/105512
§ 371 (c)(1),
(2) Date: Mar. 24, 2020

(87) PCT Pub. No.: WO2020/108011
PCT Pub. Date: Jun. 4, 2020

(65) Prior Publication Data
US 2021/0223588 A1  Jul. 22, 2021

(30) Foreign Application Priority Data

Nov. 29, 2018  (CN) .......................... 201811441329.6

(51) Int. Cl.
*G02F 1/1339* (2006.01)

(52) U.S. Cl.
CPC .................................. *G02F 1/1339* (2013.01)

(58) Field of Classification Search
CPC ...................................................... G02F 1/1339
See application file for complete search history.

(56) References Cited

U.S. PATENT DOCUMENTS

| 9,825,063 B2 | 11/2017 | Li et al. |
| 2015/0185516 A1 | 7/2015 | Lee et al. |
| 2017/0052405 A1* | 2/2017 | Yu ..................... G02F 1/133512 |

FOREIGN PATENT DOCUMENTS

| CN | 104538407 A | 4/2015 |
| CN | 107272270 A | 10/2017 |
| CN | 108169964 A | 6/2018 |
| CN | 108398835 A | 8/2018 |

* cited by examiner

*Primary Examiner* — Edmond C Lau
(74) *Attorney, Agent, or Firm* — Banner & Witcoff, Ltd.

(57) ABSTRACT

A display substrate, a manufacturing method thereof and a display apparatus are provided. The display substrate includes: a base substrate; a sealant on the base substrate; and a contact layer between the base substrate and the sealant, the contact layer being in contact with the sealant. In the display substrate, a contact layer surface of the contact layer, which is away from the base substrate (100A), is not flat at a contact position where the contact layer (50) is in contact with the sealant (300).

20 Claims, 5 Drawing Sheets

DISPLAY SUBSTRATE AND MANUFACTURING METHOD THEREOF AND DISPLAY APPARATUS

CROSS REFERENCE TO RELATED APPLICATIONS

The application is a U.S. National Phase Entry of International Application No. PCT/CN2019/105512 filed on Sep. 12, 2019, designating the United States of America and claiming priority to Chinese Patent Application No. 201811441329.6 filed on Nov. 29, 2018. The present application claims priority to and the benefit of the above-identified applications and the above-identified applications are incorporated by reference herein in their entirety.

TECHNICAL FIELD

Embodiments of the present disclosure relate to a display substrate and a manufacturing method thereof and a display apparatus.

BACKGROUND

In the field of display, an array substrate of a display panel is provided with a plurality of insulation layers and a plurality of conductive layers separated by the plurality of insulation layers. For example, the plurality of insulation layers include an inorganic insulation layer and an organic insulation layer, and the organic insulation layer may be made thicker than the inorganic insulation layer, so that the organic insulation layer can be used for reducing storage capacitance and reducing a load and power consumption.

SUMMARY

Embodiments of the present disclosure provide a display substrate and a manufacturing method thereof and a display apparatus. The display substrate has a good water vapor blocking ability.

At least one embodiment of the disclosure provides a display substrate, comprising: a base substrate; a sealant on the base substrate; and a contact layer between the base substrate and the sealant, the contact layer being in contact with the sealant, a contact layer surface of the contact layer away from the base substrate is non-flat at a contact position where the contact layer is in contact with the sealant.

For example, the contact layer surface comprises at least one contact layer groove at the contact position where the contact layer is in contact with the sealant, and the sealant extends into the at least one contact layer groove.

For example, the at least one contact layer groove comprises a first groove and a second groove, and the first groove and the second groove are different in depth.

For example, the first groove is plural and the second groove is plural, and a plurality of first grooves and a plurality of second grooves are staggered.

For example, the at least one contact layer groove comprises a closed loop-shaped groove.

For example, the display substrate further comprises an organic layer between the base substrate and the contact layer, wherein an organic layer surface of the organic layer being away from the base substrate is non-flat at a position the sealant, so that the contact layer surface is non-flat at the contact position.

For example, the organic layer surface has at least one organic layer groove at the position of the sealant, and both the contact layer and the sealant extend into the at least one organic layer groove.

For example, the at least one organic layer groove comprises at least one via-hole typed groove and at least one blind-hole typed groove, a depth of the via-hole typed groove is equal to a thickness of the organic layer, and a depth of the blind-hole typed groove is smaller than the thickness of the organic layer.

For example, the at least one organic layer groove comprises a plurality of via-hole typed grooves, and a depth of each via-hole typed groove is equal to a thickness of the organic layer.

For example, the display substrate further comprises: a first inorganic layer on the base substrate; and a second inorganic layer on a side of the first inorganic layer away from the base substrate, wherein orthographic projections of the first inorganic layer and the second inorganic layer on the base substrate both overlap with an orthographic projection of the sealant on the base substrate, and the second inorganic layer is used as the contact layer.

For example, the display substrate further comprises: a first inorganic layer on the base substrate; and a second inorganic layer on a side of the first inorganic layer away from the base substrate, wherein both the first inorganic layer and the second inorganic layer are between the contact layer and the base substrate.

For example, the display substrate further comprises: a first metal layer, a semiconductor layer, a second metal layer and an electrode layer, wherein the first inorganic layer is between the first metal layer and the semiconductor layer, the second inorganic layer is between the semiconductor layer and the second metal layer, and both the organic layer and the contact layer are between the second metal layer and the electrode layer.

For example, materials of the first inorganic layer and the second inorganic layer are same in chemical composition, and a refractive index of the first inorganic layer is greater than a refractive index of the second inorganic layer so as to increase stripping resistance of the sealant.

For example, the materials of the first inorganic layer and the second inorganic layer are same as each other, and the material is selected from the group consisting of silicon dioxide, silicon nitride, and silicon oxynitride and combination thereof.

For example, the sealant is a light curable type sealant.

At least one embodiment of the disclosure provides a display apparatus, which comprises the display substrate in above-mentioned embodiments.

At least one embodiment of the disclosure provides a manufacturing method of a display substrate, comprising: forming a contact layer on the base substrate; and forming a sealant on the contact layer, the sealant being in contact with the contact layer, a contact layer surface of the contact layer away from the base substrate is non-flat at a contact position where the contact layer is in contact with the sealant.

For example, sequentially forming a first inorganic material layer and a second inorganic material layer on the base substrate; and performing patterning processing on the first inorganic material layer and the second inorganic material layer during same mask process, so as to respectively form a first inorganic layer and a second inorganic layer, wherein the second inorganic layer is used as the contact layer; and in a dry etching process of the same mask process, a dry etching rate of the first inorganic material layer is smaller than a dry etching rate of the second inorganic material layer.

For example, sequentially forming a first inorganic material layer, a second inorganic material layer and a contact-layer material layer on the base substrate; and performing patterning processing on the first inorganic material layer the second inorganic material layer and the contact-layer material layer during same mask process, so as to respectively form a first inorganic layer, a second inorganic layer and the contact layer, wherein in a dry etching process of the same mask process, dry etching rates of the first inorganic material layer, the second inorganic material layer and the contact-layer material layer are sequentially increased.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In a display panel, due to arrangement of an organic insulation layer, paths for water vapor to enter the interior of the display panel are elongated, resulting in that reliability of a high-temperature high-humidity experiment of the display panel is reduced.

At least one embodiment of the present disclosure provides a display substrate and a manufacturing method thereof and a display apparatus. In the display substrate, a film layer (referred to "contact layer" hereafter) in contact with a sealant has a non-flat surface at a position where the film layer is in contact with the sealant, so that a position of the sealant, which is in contact with the non-flat surface, is also not flat, and thus, a path for water vapor molecules to enter a sealed region of the display panel from an interface between the sealant and the contact layer can be prolonged, thereby benefiting for increasing a water vapor blocking ability of the display panel and increasing high-temperature high-humidity reliability of the product.

The display substrate and the manufacturing method thereof and the display apparatus which are provided by the embodiments of the present disclosure will be illustrated in detail below in connection with the drawings.

Figure 1A:
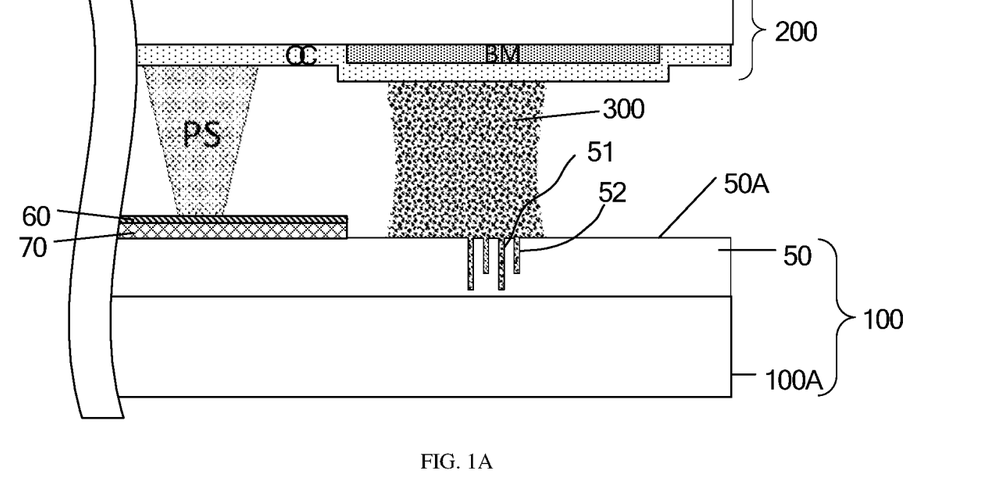
FIG. 1A is a partially cross-sectional schematic diagram of a display panel according to an embodiment of the present disclosure.
Figure 1B:
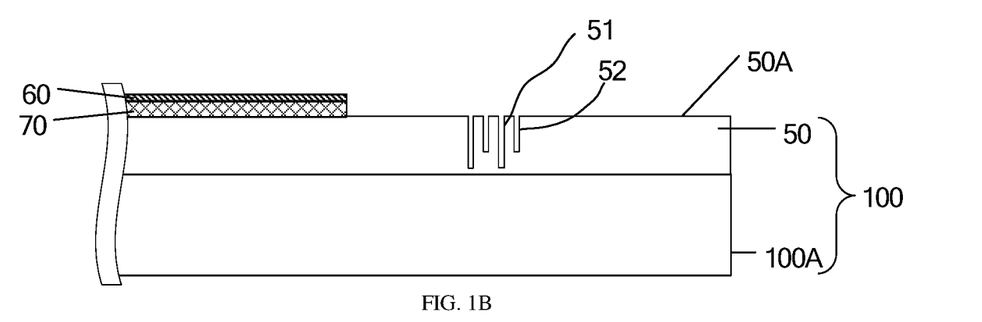
FIG. 1B is a partially schematic diagram of a display substrate as shown in FIG. 1A.

At least one embodiment of the present disclosure provides a display substrate. As shown in FIG. 1A and FIG. 1B, the display substrate includes a base substrate 100A and a sealant 300 positioned on the base substrate 100A, the display substrate further includes a contact layer 50 which is positioned between the base substrate 100A and the sealant 300 and is in contact with the sealant 300, and a contact layer surface 50A (an upper surface of the contact layer 50 as shown in the drawings) of the contact layer 50, which is away from the base substrate 100A, is not flat at a contact position where the contact layer 50 is in contact with the sealant 300, so that the sealant 300 is also not flat at the contact position. It should be noted that FIG. 1A and FIG. 1B only show part of components in the display substrate, and for example, structures such as a conductive layer, a semiconductor layer or an insulation layer and the like, which are not shown in the drawings, are also arranged between the contact layer 50 and the base substrate 100A.

For example, the base substrate 100A is a transparent substrate, such as a glass substrate, a quartz substrate or a plastic substrate and the like.

For example, the sealant 300 is organic glue, e.g., light curable glue (for example, ultraviolet light curable glue) or thermally curable glue and the like.

For example, the contact layer 50 is a transparent material layer such as an inorganic layer or an organic layer, and for example, the inorganic layer is an inorganic insulation layer, and the organic layer is an organic insulation layer.

For example, as shown in FIG. 1A and FIG. 1B, a display panel includes a first substrate 100 and a second substrate 200 which are arranged face to face, the sealant 300 connects the first substrate 100 with the second substrate 200, and the first substrate 100 includes the base substrate 100A. For example, the display panel is a liquid crystal panel, and in this case, a sealed cavity formed by the first substrate 100, the second substrate 200 and the sealant 300 is filled with a liquid crystal material so as to form a liquid crystal cell, and a spacer PS is arranged between the first substrate 100 and the second substrate 200 so as to keep a cell gap of liquid crystals. It should be noted that embodiments of the display panel include, but are not limited to, the liquid crystal panel.

For example, the first substrate 100 is an array substrate, the array substrate is provided with switching elements (e.g., a transistor) arranged in an array and pixel electrodes respectively and electrically connected with the switching elements, and the first substrate 100 further includes an electrode layer 70 and an alignment layer 60 covering the electrode layer 70. For example, the alignment layer 60 and the sealant 300 do not overlap with each other. For example, the electrode layer 70 is a pixel electrode layer including the pixel electrode, alternatively, the electrode layer 70 includes a strip-shaped pixel electrode and a strip-shaped common electrode which are alternately arranged; and in other embodiments, the first substrate 100 further includes another electrode layer overlapping with the electrode layer 70, one of the another electrode layer and the electrode layer 70 is a pixel electrode layer including the pixel electrode, and the other one of the another electrode layer and the electrode layer 70 is a common electrode layer including the common electrode.

For example, the second substrate 200 includes the base substrate (e.g., the transparent substrate such as the glass substrate, the quartz substrate or the plastic substrate and the like), a black matrix BM positioned on the base substrate and an overcoat layer OC positioned between the black matrix BM and the sealant 300. For example, the second substrate 200 is a color filter substrate including a color filter layer.

For example, in order to transfer a shape of a non-flat portion of the contact layer surface 50A of the contact layer 50 to the sealant 300, the contact layer 50 contacts the sealant 300 in such a mode that: the contact layer surface 50A of the contact layer 50, which is away from the base substrate 100A, is provided with at least one contact layer groove at the contact position where the contact layer 50 is in contact with the sealant 300, and the sealant 300 extends into the at least one contact layer groove.

For example, the at least one contact layer groove formed on the contact layer surface 50A of the contact layer 50 includes different depths of grooves. For example, as shown in FIG. 1A and FIG. 1B, the at least one contact layer grooves formed on the contact layer surface 50A of the contact layer 50 includes a first groove 51 and a second groove 52, and the first groove 51 and the second groove 52 have different depths. In a case that the contact layer 50 is formed of an organic insulation layer, an organic material in a bottom of the groove with a relatively small depth among the first groove 51 and the second groove 52 can absorb part of water molecules so as to further reduce the water molecules entering a sealed region; and similarly, in a case that the contact layer 50 is formed of an inorganic insulation layer and the contact layer 50 covers the organic insulation layer, the organic material in the bottom of the groove with the relatively small depth among the first groove 51 and the second groove 52 can absorb part of water molecules, so as to further reduce the water molecules entering the sealed region.

In other embodiments, for example, the at least one contact layer groove formed on the contact layer surface 50A of the contact layer 50 is the same in depth.

For example, in order to further increase the water vapor blocking ability of the display panel, as shown in FIG. 1A and FIG. 1B, the at least one contact layer groove formed on the contact layer surface 50A of the contact layer 50 includes a plurality of first grooves 51 and a plurality of second grooves 52. The plurality of first grooves 51 and the plurality of second grooves 52 are staggered, i.e., the second groove 52 is arranged between at least two adjacent first grooves 51, and/or the first groove 51 is arranged between at least two adjacent second grooves 52. For example, the plurality of first grooves 51 and the plurality of second grooves 52 are alternately and cyclically arranged, i.e., one second groove 52 is arranged between any two adjacent first grooves 51 and one first groove 51 is arranged between any two adjacent second grooves 52.

Figure 1C:
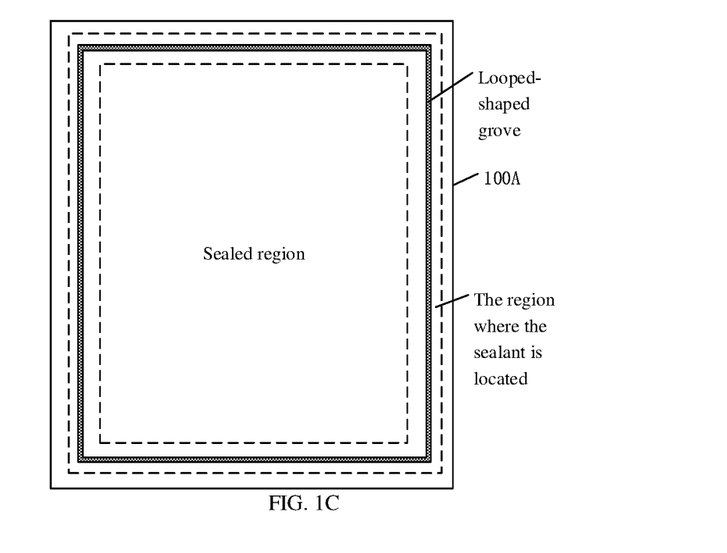
FIG. 1C is a top-view schematic diagram of a partial structure in the display substrate as shown in FIG. 1A.

For example, in order to further increase the water vapor blocking ability of the display panel, as shown in FIG. 1C, the at least one contact layer groove formed on the contact layer surface 50A of the contact layer 50 includes a closed loop-shaped groove (with reference to a deep color loop shape in FIG. 1C). For example, the at least one contact layer groove includes a plurality of closed loop-shaped grooves, and for example, both the first groove 51 and the second groove 52 are the closed loop-shaped grooves. It should be noted that a region surrounded by two dotted lines in FIG. 1C is a region where the sealant 300 is positioned, a region surrounded by the region where the sealant 300 is positioned is the sealed region. For example, the aforementioned spacer PS, the alignment layer 60 and the electrode layer 70 are arranged in the sealed region.

Figure 2A:
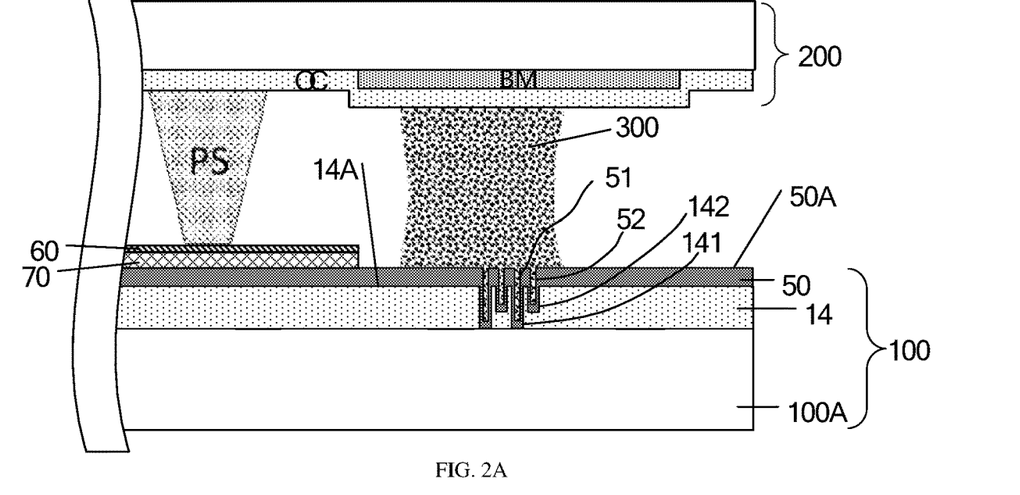
FIG. 2A is a partially cross-sectional schematic diagram of a display panel according to another embodiment of the present disclosure.
Figure 2B:
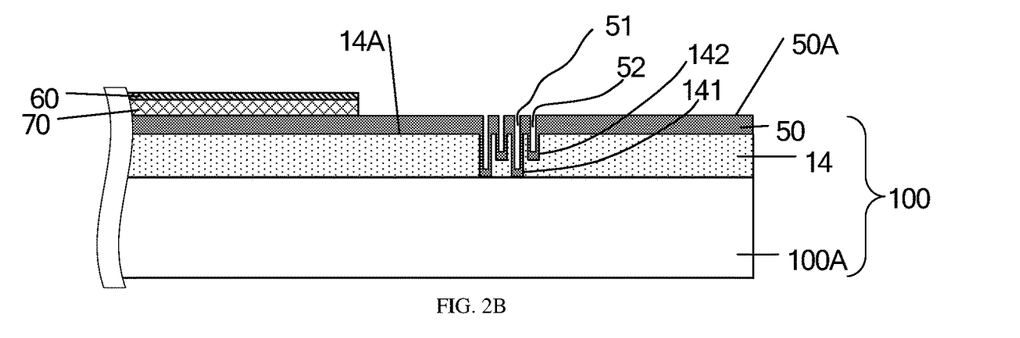
FIG. 2B is a partially schematic diagram of a display substrate as shown in FIG. 2A.

For example, a non-flat organic layer is formed on the base substrate 100A, and then the contact layer 50 covering the organic layer (for example, the contact layer 50 covers and is in direct contact with the organic layer) is formed, in this way, the contact layer surface 50A of the contact layer 50 is not flat at the contact position where the contact layer 50 is in contact with the sealant 300. In this case, for example, as shown in FIG. 2A and FIG. 2B, a display substrate provided by at least one embodiment of the present disclosure further includes an organic layer 14 positioned between the base substrate 100A and the contact layer 50. An organic layer surface 14A (with reference to an upper surface of the organic layer 14 in the drawings) of the organic layer 14, which is away from the base substrate 100A, is not flat at a position of the sealant 300, that is, the organic layer surface 14A of the organic layer 14 is provided with a non-flat portion overlapping with the sealant 300, so that the contact layer surface 50A of the contact layer 50 is not flat at the contact position.

It should be noted that FIG. 2A and FIG. 2B only show part of components in the display substrate, and for example, structures such as a conductive layer, a semiconductor layer or an insulation layer and the like, which are not shown in the drawings, are also arranged between the organic layer 14 and the base substrate 100A. In addition, the arrangement mode of the contact layer 50 and the sealant 300 in FIG. 2A and FIG. 2B can refer to related description in the embodiment as shown in FIG. 1A and FIG. 1B, and is not repeated herein.

In the embodiment of the present disclosure, even if both the contact layer 50 and the non-flat portion overlap with the sealant 300, the mask plate for forming the contact layer 50 doesn't need to change, because the non-flat organic layer 14 is firstly formed and then the contact layer in direct contact with the organic layer 14 is formed, in this way, the non-flat portion of the contact layer 50 is formed. It only needs to avoid that the formed contact layer 50 fills and levels up the non-flat portion of the organic layer 14. For example, as shown in FIG. 2A and FIG. 2B, the contact layer 50 is not flat and is continuous at the position of the non-flat portion of the organic layer 14.

Figure 2C:
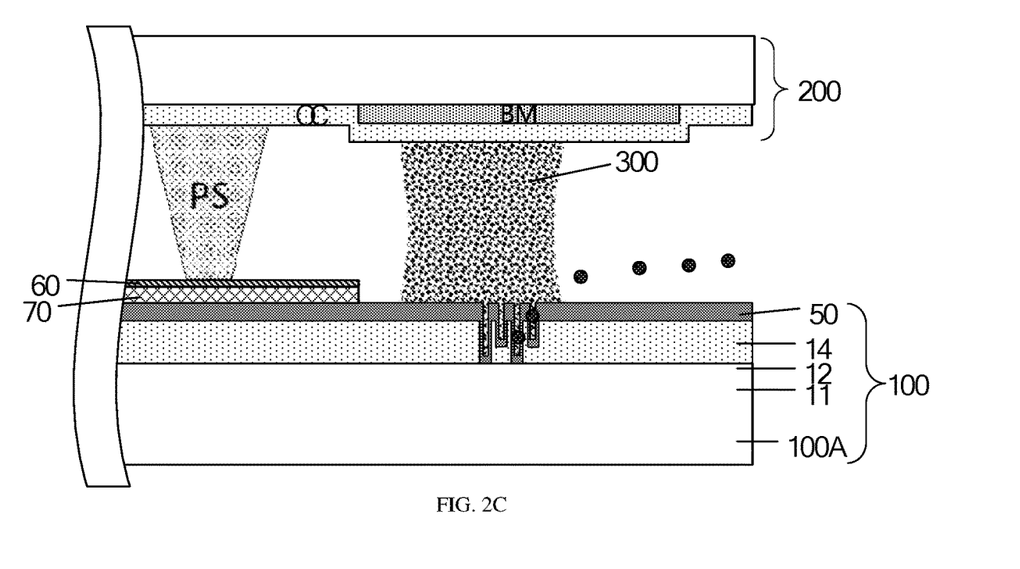
FIG. 2C is a schematic diagram of the display substrate as shown in FIG. 2A blocking water vapor.

For example, the organic layer surface 14A of the organic layer 14, which is away from the base substrate 100A, is provided with at least one organic layer groove at the position of the sealant 300, the contact layer 50 extends into the at least one organic layer groove, and the sealant 300 also extends into the at least one organic layer groove. In the embodiment of the present disclosure, the organic layer 14 can be made thicker, which enables the organic layer groove in the organic layer 14 to have a large depth, so that a portion of the sealant 300, which extends into the organic layer groove, has a large length, thereby further benefiting for prolonging the path for the water molecules to enter the sealed region (the entrance path of the water molecules can refer to FIG. 2C) to further increase the water vapor blocking ability of the display panel.

In order to avoid a case that an excessive opening width of the organic layer groove causes large influence on the water vapor blocking ability of the display panel, the opening width of the at least one organic layer groove in the organic layer 14 is, for example, smaller than or equal to 10 micrometers, i.e., a size of an orthographic projection of each organic layer groove on the base substrate 100A is smaller than or equal to 10 micrometers. In consideration of accuracy of the mask for producing the organic layer 14, for example, the opening width of each organic layer groove is greater than or equal to 6 micrometers and less than or equal to 10 micrometers.

For example, as shown in FIG. 2A and FIG. 2B, the at least one organic layer groove disposed on the organic layer surface 14A of the organic layer 14 and at the position of the sealant 300 includes at least one via-hole typed groove 141 and at least one blind-hole typed groove 142, a depth of the via-hole typed groove 141 is equal to a thickness of the organic layer 14 so as to enable the via-hole typed groove 141 to penetrate the organic layer 14, and a depth of the blind-hole typed groove 142 is smaller than the thickness of the organic layer 14. A material of the organic layer at the position of the blind-hole typed groove 142 can absorb part of water molecules so as to further reduce the water molecule entering the sealed region.

Figure 2D:
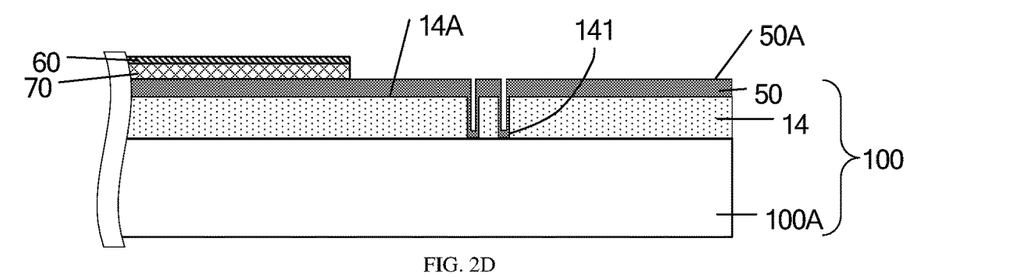
FIG. 2D is a cross-sectional schematic diagram of a display substrate including two through-hole grooves according to yet another embodiment of the present disclosure.
Figure 2E:
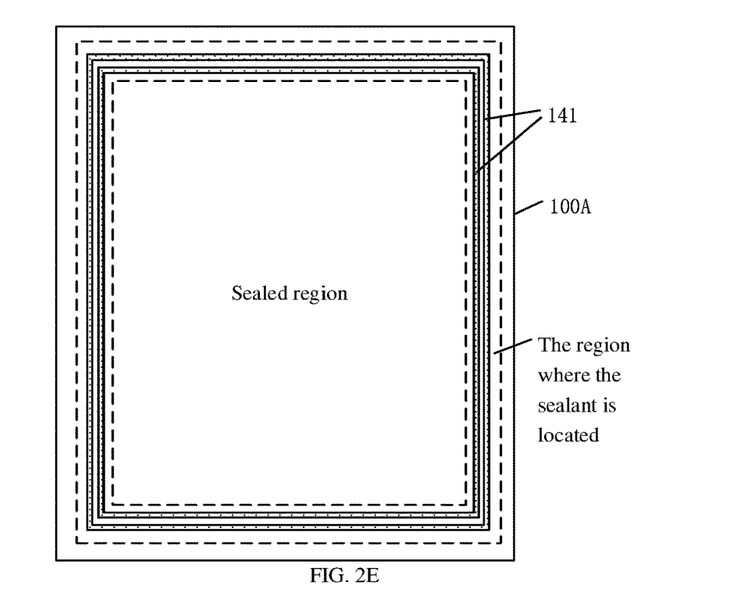
FIG. 2E is a top-view schematic diagram of two through-hole grooves as shown in FIG. 2D.

For example, as shown in FIG. 2D, the organic layer groove includes a plurality of via-hole typed grooves 141 (in FIG. 2D, there are two via-hole typed grooves for example), and the depth of each via-hole typed groove 141 is equal to the thickness of the organic layer 14. For example, as shown in FIG. 2E, each via-hole typed groove 141 is a closed loop-shaped groove.

For example, in any one of embodiments of the present disclosure, the organic layer 14 can be made from resin or a similar transparent insulation organic material so as to obtain a large thickness.

Figure 3:
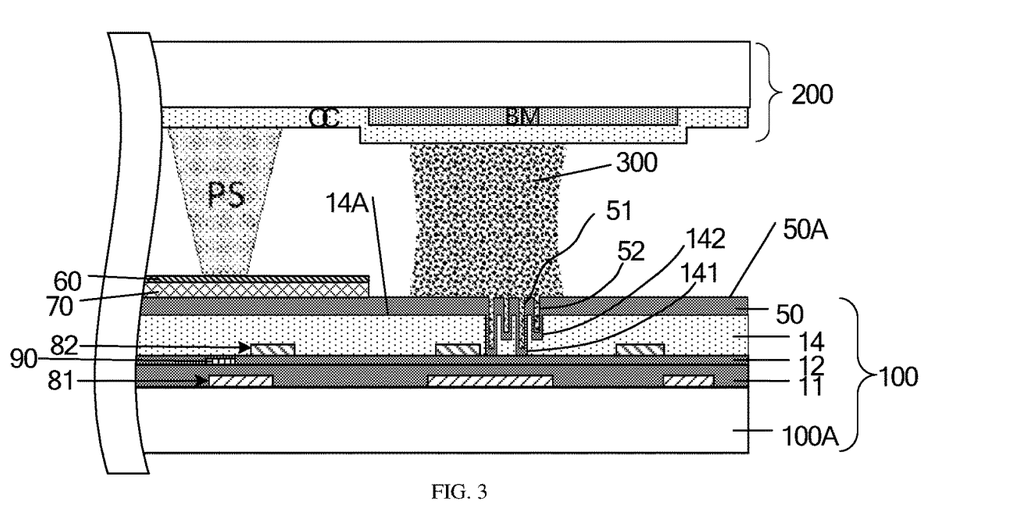
FIG. 3 is a partially sectional schematic diagram of a display panel according to still another embodiment of the present disclosure.

For example, as shown in FIG. 3, a display substrate provided by at least one embodiment of the present disclosure includes a first inorganic layer 11 positioned on the base substrate 100A and a second inorganic layer 12 positioned on a side of the first inorganic layer 11, which is away from the base substrate 100A. Orthographic projections of the first inorganic layer 11 and the second inorganic layer 12 on the base substrate 100A both overlap with an orthographic projection of the sealant 300 on the base substrate 100A, and both orthographic projections of the first inorganic layer 11 and the second inorganic layer 12 on the base substrate 100A are positioned between the contact layer 50 and the base substrate 100A. Herein, the term "overlap" means that there is an overlap region between comparison objects, and thus, the comparison objects may completely coincide with each other, and also may partially coincide with each other. In this embodiment, each of the orthographic projections of the first inorganic layer 11 and the second inorganic layer 12 on the base substrate 100A has an overlap region with the orthographic projection of the sealant 300 on the base substrate 100A, and the non-flat surface of the contact layer 50 is formed in the overlap regions, so as to further increase the water vapor blocking ability of the display panel. It should be noted that the arrangement mode of the contact layer 50 and the sealant 300 in the embodiment as shown in FIG. 3 can refer to related description in the embodiment as shown in FIG. 1A and FIG. 1B, and the arrangement mode of the organic layer 14 in the embodiment as shown in FIG. 3 can refer to related description in the embodiment as shown in FIG. 2A and FIG. 2B, which are not repeated herein.

For example, the first inorganic layer 11, the second inorganic layer 12 and the contact layer 50 are all inorganic insulation layers. For example, as shown in FIG. 3, a first metal layer 81, a semiconductor layer 90, a second metal layer 82 and an electrode layer 70 are sequentially arranged on the base substrate 100A. The first inorganic layer 11 is positioned between the first metal layer 81 and the semiconductor layer 90, the second inorganic layer 12 is positioned between the semiconductor layer 90 and the second metal layer 82, and both the organic layer 14 and the contact layer 50 are positioned between the second metal layer 82 and the electrode layer 70.

Figure 4:
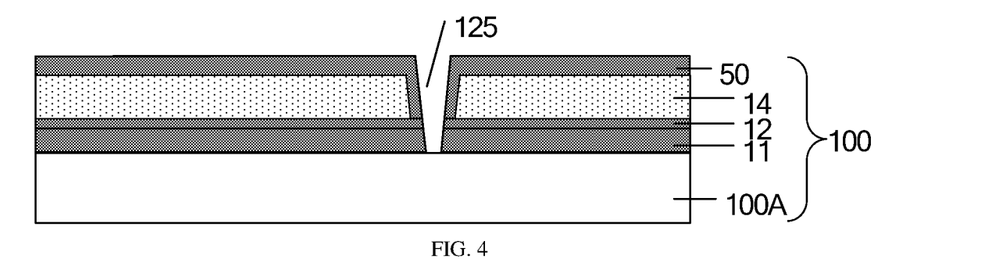
FIG. 4 is a schematic diagram of a display substrate having via holes disposed in a plurality of inorganic layers according to an embodiment of the present disclosure.

For example, the first inorganic layer 11, the second inorganic layer 12 and the contact layer 50 can be formed by the same mask process (i.e., a patterning process achieved by using the same mask). For example, in the same mask process, a via hole 125 as shown in FIG. 4, which simultaneously penetrates the first inorganic layer 11, the second inorganic layer 12 and the contact layer 50, is formed by dry etching. The via hole 125 is used for implementing, for example, an electrical connection between a conductive structure which the electrode layer 70 includes and a conductive structure which the first metal layer 81 includes.

For example, for the same dry etching process (i.e., a dry etching step which the same mask process includes), dry etching rates of the first inorganic layer 11, the second inorganic layer 12 and the contact layer 50 are sequentially increased (i.e., the smaller a distance to the base substrate 100A is, the smaller the dry etching rate is); in other words, the layer further away from the base substrate 100A is easier to etch. It is beneficial for enabling the via hole 125 simultaneously penetrating the first inorganic layer 11, the second inorganic layer 12 and the contact layer 50 to have a good appearance, i.e., an opening size of the via hole 125 is gradually increased in a direction away from the base substrate, so as to ensure the electrical connection between different conductive structures at the position of the via hole 125.

In study, an inventor of the present application founds that, in a case that materials of the plurality of inorganic layers which the display substrate includes adopt the same chemical composition, the higher refractive index of the inorganic layer is, the smaller the dry etching rate of the inorganic layer is. Based on this, the inventor of the present application notices that a good dry etching effect and a high light-transmittance can be simultaneously obtained while the materials of the first inorganic layer 11, the second inorganic layer 12 and the contact layer 50 are same in their chemical compositions and the refractive indices of the first inorganic layer 11, the second inorganic layer 12 and the contact layer 50 are sequentially reduced (i.e., the smaller the distance to the base substrate 100A is, the higher the refractive index is). Namely, after dry-etching, a laminated structure of the first inorganic layer 11, the second inorganic layer 12 and the contact layer 50 not only has a high light transmittance, but also makes the via hole 125 having the good appearance. In a case that the sealant 300 is the light curable type sealant, a good curable effect can be obtained so as to promote stripping resistance of the sealant 300.

Figure 5:
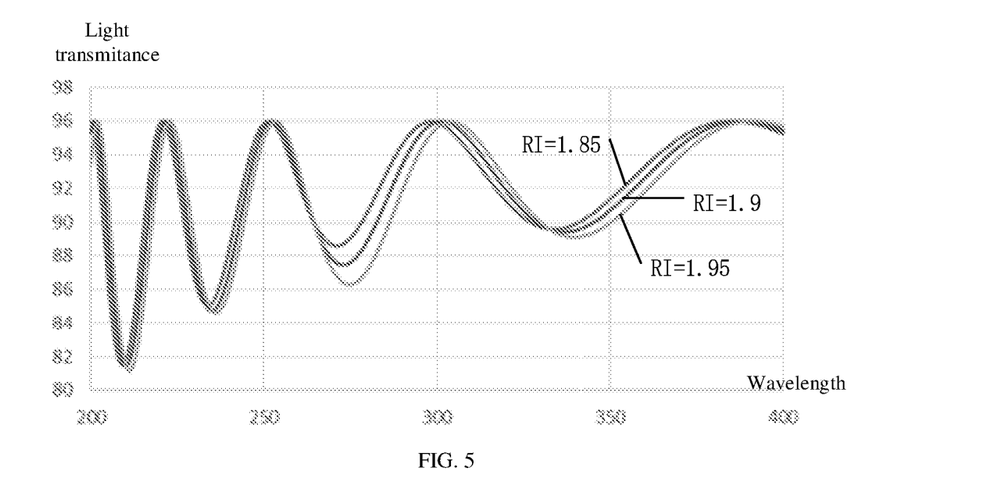
FIG. 5 is a light-transmittance graph showing a plurality of inorganic layers in a display substrate having different refractive indices according to an embodiment of the present disclosure.

For example, a material of the first inorganic layer 11, the second inorganic layer 12 and the contact layer 50 is selected from a group consisting of silicon dioxide, silicon nitride, and silicon oxynitride and combination thereof. For example, all the first inorganic layer 11, the second inorganic layer 12 and the contact layer 50 are silicon dioxide thin films, or are silicon nitride thin films, or are silicon oxynitride thin film. The refractive indices of the first inorganic layer 11, the second inorganic layer 12 and the contact layer 50 are sequentially reduced, and in this case, for ultraviolet light in a wavelength range of 335 nm to 385 nm or ultraviolet light in a wavelength range of 275 nm to 300 nm, the light transmittances of the first inorganic layer 11, the second inorganic layer 12 and the contact layer 50 are sequentially increased. For example, as shown in FIG. 5, the refractive indices (RI) of the first inorganic layer 11, the second inorganic layer 12 and the contact layer 50 are 1.95, 1.9 and 1.85 respectively, and for the ultraviolet light in the wavelength range of 335 nm to 385 nm or the ultraviolet light in the wavelength range of 275 nm to 300 nm, their light transmittances are sequentially increased along with increase of the refractive indices.

In other embodiments, for example, the materials of the first inorganic layer 11 and the second inorganic layer 12 are the same in chemical composition, and the refractive index of the first inorganic layer 11 is greater than the refractive index of the second inorganic layer 12; alternatively, the material of one of the first inorganic layer 11 and the second inorganic layer 12 has same chemical composition with the contact layer 50, and the refractive index of one of the first inorganic layer 11 and the second inorganic layer 12 is greater than the refractive index of the second inorganic layer 12.

Figure 6:
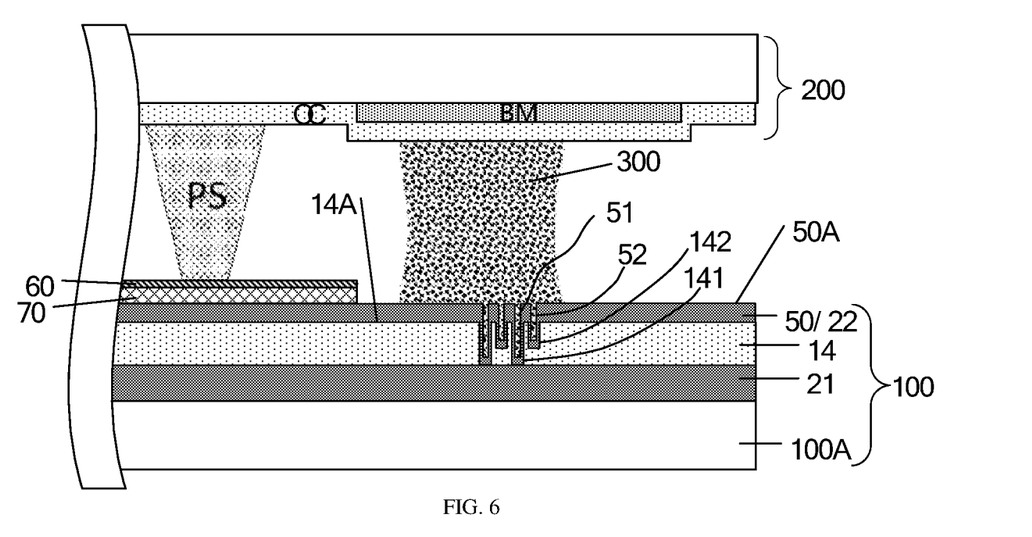
FIG. 6 is a partially cross-sectional schematic diagram of a display panel according to another embodiment of the present disclosure.

In other embodiments, for example, as shown in FIG. 6, a display substrate provided by at least one embodiment of the present disclosure includes a first inorganic layer 21 covering the base substrate 100A and a second inorganic layer 22 covering the first inorganic layer 21, both the first inorganic layer 21 and the second inorganic layer 22 overlap with the sealant 300, and the second inorganic layer 22 is used as the contact layer 50.

It should be noted that FIG. 6 only shows part of components of the display substrate, and for example, structures such as a conductive layer, a semiconductor layer or an insulation layer and the like, which are not shown in the drawing, are also arranged between the first inorganic layer 21 and the base substrate 100A. In addition, the arrangement mode of the contact layer 50 and the sealant 300 in the embodiment as shown in FIG. 6 can refer related description in the embodiment as shown in FIG. 1A and FIG. 1B, and the arrangement mode of the organic layer 14 in the embodiment as shown in FIG. 6 can refer to related description in the embodiment as shown in FIG. 2A and FIG. 2B, which are not repeated herein.

For example, for the same dry etching process, a dry etching rate of the first inorganic layer 21 is smaller than a dry etching rate of the second inorganic layer 22. It is beneficial for enabling a via hole simultaneously penetrating the first inorganic layer 21 and the second inorganic layer 22 to have a good appearance so as to ensure an electrical connection between different conductive structures at the position of the via hole.

For example, materials of the first inorganic layer 21 and the second inorganic layer 22 are the same in chemical composition and a refractive index of the first inorganic layer 21 is greater than a refractive index of the second inorganic layer 22, which not only are beneficial for enabling a laminated structure of the first inorganic layer 21 and the second inorganic layer 22 to form the via hole with the good appearance after dry etching, but also can enable the laminated structure to have a high light transmittance.

For example, both the first inorganic layer 21 and the second inorganic layer 22 are silicon dioxide thin films, or are silicon nitride thin films or are silicon oxynitride thin films, and the refractive index of the first inorganic layer 21 is greater than the refractive index of the second inorganic layer 22. In this case, for the ultraviolet light in the wavelength range of 335 nm to 385 nm or the ultraviolet light in the wavelength range of 275 nm to 300 nm, a light transmittance of the first inorganic layer 21 is smaller than a light transmittance of the second inorganic layer 22, so that the laminated structure of the first inorganic layer 21 and the second inorganic layer 22 has a high light transmittance.

At least one embodiment of the present disclosure further provides a display apparatus, which includes the display substrate according to any one of the aforementioned embodiments.

For example, the display apparatus provided by the embodiment of the present disclosure can be any product or component with a display function, such as a liquid crystal panel, electronic paper, an Organic Light-Emitting Diode (OLED) panel, a mobile phone, a laptop personal computer, a television, a display, a notebook computer, a digital photo frame, a navigator and the like.

At least one embodiment of the present disclosure further provides a manufacturing method of a display substrate. By taking the display substrate as shown in FIG. 1A, FIG. 2A, FIG. 3 and FIG. 6 as an example, the method includes: forming the contact layer 50 on the base substrate 100A; and forming the sealant 300 on the contact layer 50, the sealant 300 being in contact with the contact layer 50, such that the contact layer surface 50A of the contact layer 50, which is away from the base substrate 100A, is not flat at the contact position where the contact layer 50 is in contact with the sealant 300.

For example, the sealant 300 is formed by a curing process. For example, the sealant 300 is formed by a light curing (e.g., an ultraviolet curing) process. For example, wet glue for forming the sealant 300 is irradiated by the light from the same side of the base substrate 100 to be cured, so as to obtain the sealant 300. For example, the sealant 300 is also formed by a thermal curing process.

It should be noted that as shown in FIG. 1A, FIG. 2A, FIG. 3 and FIG. 6, the display panel includes a first substrate 100 and a second substrate 200 which are arranged face to face. In the manufacturing method provided by the embodiment of the present disclosure, the wet glue is first coated on the first substrate 100, and then, the wet glue is connected with the second substrate 200, next, the wet glue is cured to obtain the sealant 300; alternatively, the wet glue is first coated on the second substrate 200, and then, the wet glue is connected with the first substrate 100, next, the wet glue is cured to obtain the sealant 300.

Figure 7:
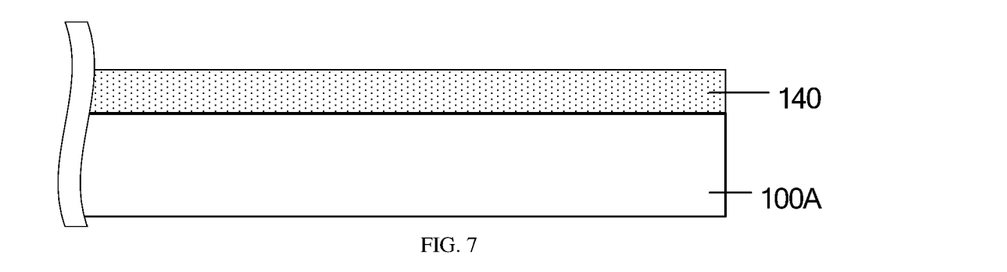
FIG. 7 is a schematic diagram of forming an organic material layer on a base substrate in a manufacturing method of a display substrate according to an embodiment of the present disclosure.

For example, the manufacturing method provided by at least one embodiment of the present disclosure further includes: as shown in FIG. 7, forming an organic material layer 140 on the base substrate 100A; and forming the organic layer 14 as shown in FIG. 2A, FIG. 3 and FIG. 6 by performing patterning processing on the organic material layer 140; the organic layer surface 14A of the organic layer 14, which is away from the base substrate 100 A, is not flat at the position of the sealant 300, so that the contact layer surface 50A of the contact layer 50 is not flat at the contact position.

For example, patterning processing for forming the organic layer 14 includes steps of performing exposure process on the organic material layer 140 by using a mask and performing development process on the exposed material. In this case, the organic layer 14 is produced by adopting a photoresist, and for example, the organic layer 14 adopts a negative photoresist so as to obtain a better water vapor blocking ability; alternatively, patterning processing for forming the organic layer 14 includes steps of coating the photoresist, performing exposure process on the photoresist by using the mask, performing development process on the exposed photoresist to form a photoresist pattern and performing etching process by using the photoresist pattern.

Figure 8A:
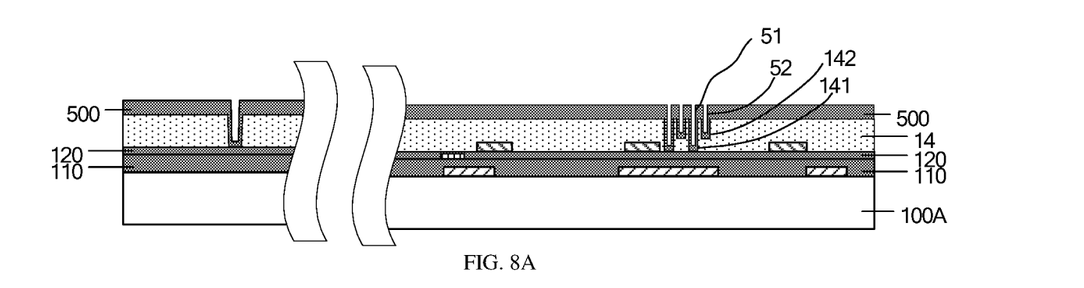
FIG. 8A and FIG. 8B are schematic diagrams of forming a first inorganic layer, a second inorganic layer and a contact layer in a manufacturing method of a display substrate according to an embodiment of the present disclosure.
Figure 8B:
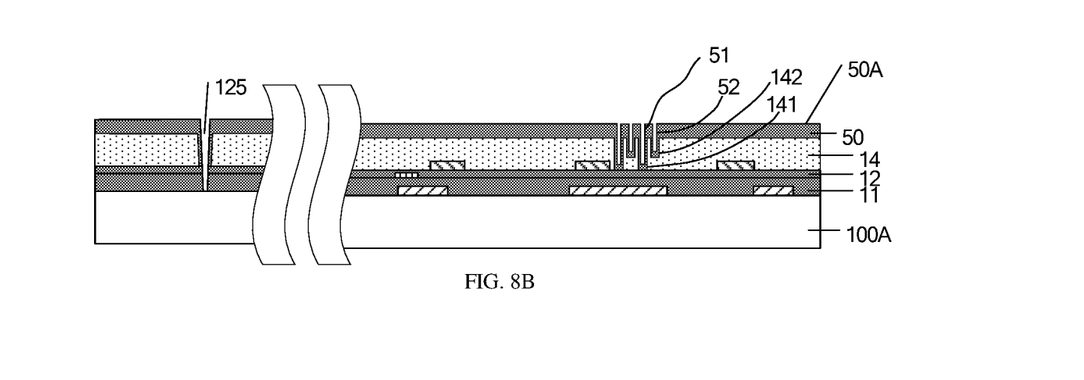

For example, for the display substrate as shown in FIG. 3, a manufacturing method provided by at least one embodiment of the present disclosure includes: as shown in FIG. 8A, sequentially forming a first inorganic material layer 110, a second inorganic material layer 120 and a contact-layer material layer 500 on the base substrate 100A. For example, the patterned organic layer 14 is formed after the formation of the first inorganic material layer 110 and the second inorganic material layer 120, and then the contact-layer material layer 500 is formed on the organic layer 1. In the same mask process, the patterning processing is performed on the first inorganic material layer 110, the second inorganic material layer 120 and the contact-layer material layer 500 so as to respectively form the first inorganic layer 11, the second inorganic layer 12 and the contact layer 50, as shown in FIG. 8B. For a dry etching process which the same mask process includes, dry etching rates of the first inorganic material layer 110, the second inorganic material layer 120 and the contact-layer material layer 500 are sequentially increased. It is beneficial for enabling the via hole 125 simultaneously penetrating the first inorganic layer 11, the second inorganic layer 12 and the contact layer 50 to have a good appearance, i.e., the opening size of the via hole 125 is gradually increased in the direction away from the base substrate, so as to ensure the electrical connection between different conductive structures at the position of the via hole 125.

For example, a mask process includes steps of coating the photoresist, performing exposure process on the photoresist by using a mask, performing development process on the exposed photoresist to form the photoresist pattern and performing dry etching based on the photoresist pattern.

For example, materials of the first inorganic layer 11, the second inorganic layer 12 and the contact layer 50 are the same in chemical composition and the refractive indices of the first inorganic layer 11, the second inorganic layer 12 and the contact layer 50 are sequentially reduced, in this way, after dry-etching, a laminated structure of the first inorganic layer 11, the second inorganic layer 12 and the contact layer 50 not only has a high light transmittance, but also makes the via hole 125 having the good appearance. In a case that the sealant 300 is the light curable type sealant, a good curable effect can be obtained so as to promote stripping resistance of the sealant 300.

For example, a material of the first inorganic layer 11, the second inorganic layer 12 and the contact layer 50 is selected from a group consisting of silicon dioxide, silicon nitride, and silicon oxynitride and combination thereof. For example, all the first inorganic layer 11, the second inorganic layer 12 and the contact layer 50 are silicon dioxide thin films, or are silicon nitride thin films or are silicon oxynitride thin film. The refractive indices of the first inorganic layer 11, the second inorganic layer 12 and the contact layer 50 are sequentially reduced, and in this case, in the manufacturing method provided by at least one embodiment of the present disclosure, forming the sealant 300 includes: irradiating the wet glue for forming the sealant 300 from one side of the base substrate 100A by using ultraviolet light in a wavelength range of 335 nm to 385 nm or ultraviolet light in a wavelength range of 275 nm to 300 nm so as to obtain the cured sealant 300.

For example, the first inorganic layer 11, the second inorganic layer 12 and the contact layer 50 are all formed by using chemical vapor deposition, or plasma enhanced chemical vapor deposition, or other methods. For example, in a case that the first inorganic layer 11, the second inorganic layer 12 and the contact layer 50 are all the silicon nitride thin films, a plurality of silicon nitride thin films which are the same in chemical composition but different in refractive index are formed by regulating the following parameters, such as a radio frequency power, a pressure in a film forming chamber, concentrations of reaction gases silane (SiH4) and ammonia gas (NH3) and the like.

Figure 9:
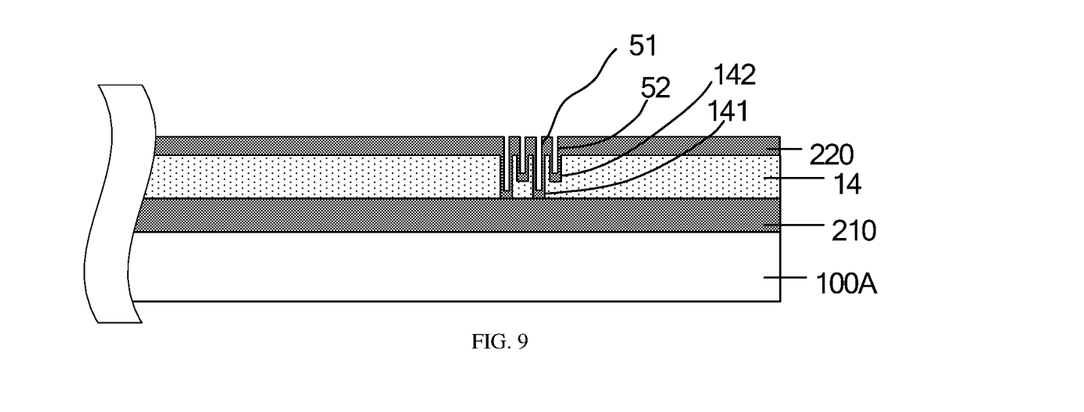
FIG. 9 is a schematic diagram of forming a first inorganic material layer and a second inorganic material layer on a base substrate in a manufacturing method of a display substrate according to an embodiment of the present disclosure.

For example, for the display substrate as shown in FIG. 6, a manufacturing method provided by at least one embodiment of the present disclosure includes: as shown in FIG. 9, sequentially forming a first inorganic material layer 210 and a second inorganic material layer 220 between the base substrate 100A and the sealant 300; and in the same mask process, performing patterning processing on the first inorganic material layer 210 and the second inorganic material layer 220 to respectively form the first inorganic layer 21 and the second inorganic layer 22 as shown in FIG. 6, the second inorganic layer 22 being used as the contact layer 50;

for a dry etching process which the same mask process includes, a dry etching rate of the first inorganic material layer 210 being smaller than a dry etching rate of the second inorganic material layer 220.

For example, both the first inorganic layer 21 and the second inorganic layer 22 are silicon dioxide thin films, or are silicon nitride thin films or are silicon oxynitride thin films, and the refractive indices of the first inorganic layer 21 and the second inorganic layer 22 are sequentially reduced. In this case, in the manufacturing method provided by at least one embodiment of the present disclosure, forming the sealant 300 includes: irradiating the wet glue for forming the sealant 300 from one side of the base substrate 100A by using ultraviolet light in a wavelength range of 335 nm to 385 nm or ultraviolet light in a wavelength range of 275 nm to 300 nm so as to obtain the cured sealant 300.

For example, both the first inorganic layer 21 and the second inorganic layer 22 are formed by using chemical vapor deposition, or plasma enhanced chemical vapor deposition, or other methods. For example, a plurality of thin films which are the same in chemical composition but different in refractive index can be formed by regulating the following parameters, such as the radio frequency power, the pressure in a film forming chamber, concentrations of reaction gases and the like.

In the manufacturing method provided by the embodiments of the present disclosure, the arrangement mode of each component can refer to related description in the embodiments of the display substrate, and is not repeated herein.

In view of foregoing, the embodiments of the present disclosure provide the display substrate and the manufacturing method thereof and the display apparatus. The film layer in contact with the sealant has the non-flat surface at the position where the film layer is in contact with the sealant, so that the sealant is a non-flat at a position where the sealant is in contact with the non-flat surface. Thus, the path for the water vapor molecules to enter the sealed region of the display panel from the interface between the sealant and the contact layer can be prolonged, thereby benefiting for increasing the water vapor blocking ability of the display panel. In some embodiments, in a case of forming the sealant by using a light curable process, the transmittance of light for curing the sealant can be increased by enabling the materials of a plurality of inorganic layers between the sealant and the base substrate to be the same in chemical composition and enabling their refractive indices to be sequentially reduced, so as to increase the curing effect and stripping resistance of the sealant.

In the disclosure, the following should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and a size of a layer or area may be enlarged or narrowed, that is, the drawings are not drawn in a real scale.

(3) In case of no conflict, features in one embodiment or in different embodiments can be combined as a new embodiment.

What is described above is related to the illustrative embodiments of the disclosure only and not limitative to the scope of the disclosure; the scopes of the disclosure are defined by the accompanying claims.

The invention claimed is:

1. A display substrate, comprising:
   a base substrate;
   a sealant on the base substrate; and
   a contact layer between the base substrate and the sealant, the contact layer being in contact with the sealant, a contact layer surface of the contact layer away from the base substrate is non-flat at a contact position where the contact layer is in contact with the sealant,
   wherein the contact layer surface comprises at least one contact layer groove at the contact position where the contact layer is in contact with the sealant, the at least one contact layer groove comprises at least one first groove and at least one second groove, and the at least one first groove and the at least one second groove are different in depth.

2. The display substrate according to claim 1, wherein the sealant extends into the at least one contact layer groove.

3. The display substrate according to claim 1, wherein the at least one first groove comprises a plurality of first grooves and the at least one second groove comprises is a plurality of second grooves, and the plurality of first grooves and the plurality of second grooves are staggered.

4. The display substrate according to claim 2, wherein the at least one contact layer groove comprises a closed loop-shaped groove.

5. The display substrate according to claim 1, further comprising:
   an organic layer between the base substrate and the contact layer, wherein an organic layer surface of the organic layer away from the base substrate is non-flat at a position of the sealant, so that the contact layer surface is non-flat at the contact position.

6. The display substrate according to claim 5, wherein the organic layer surface has at least one organic layer groove at the position of the sealant, and both the contact layer and the sealant extend into the at least one organic layer groove.

7. The display substrate according to claim 6, wherein the at least one organic layer groove comprises at least one via-hole typed groove and at least one blind-hole typed groove, a depth of the at least one via-hole typed groove is equal to a thickness of the organic layer, and a depth of the at least one blind-hole typed groove is smaller than the thickness of the organic layer.

8. The display substrate according to claim 6, wherein the at least one organic layer groove comprises a plurality of via-hole typed grooves, and a depth of each via-hole typed groove is equal to a thickness of the organic layer.

9. The display substrate according to claim 1, further comprising:
   a first inorganic layer on the base substrate,
   wherein the contact layer comprises a second inorganic layer on a side of the first inorganic layer away from the base substrate,
   wherein orthographic projections of the first inorganic layer and the second inorganic layer on the base substrate both overlap with an orthographic projection of the sealant on the base substrate.

10. The display substrate according to claim 1, further comprising:
    a first inorganic layer on the base substrate; and
    a second inorganic layer on a side of the first inorganic layer away from the base substrate,
    wherein both the first inorganic layer and the second inorganic layer are between the contact layer and the base substrate.

11. The display substrate according to claim 10, further comprising: a first metal layer, a semiconductor layer, a second metal layer, and an electrode layer, wherein the first inorganic layer is between the first metal layer and the semiconductor layer, the second inorganic layer is between the semiconductor layer and the second metal layer, and both an organic layer and the contact layer are between the second metal layer and the electrode layer.

12. The display substrate according to claim 9, wherein materials of the first inorganic layer and the second inorganic layer are same in chemical composition, and a refractive index of the first inorganic layer is greater than a refractive index of the second inorganic layer so as to increase stripping resistance of the sealant.

13. The display substrate according to claim 12, wherein the materials of the first inorganic layer and the second inorganic layer are same as each other, and the materials are selected from the group consisting of silicon dioxide, silicon nitride, and silicon oxynitride and combination thereof.

14. The display substrate according to claim 1, wherein the sealant is a light curable type sealant.

15. A display apparatus, comprising the display substrate according to claim 1.

16. A manufacturing method of a display substrate, comprising:
    forming a contact layer on a base substrate; and
    forming a sealant on the contact layer, the sealant being in contact with the contact layer, a contact layer surface of the contact layer away from the base substrate is non-flat at a contact position where the contact layer is in contact with the sealant,
    wherein the contact layer surface comprises at least one contact layer groove at the contact position where the contact layer is in contact with the sealant, the at least one contact layer groove comprises at least one first groove and at least one second groove, and the at least one first groove and the at least one second groove are different in depth.

17. The manufacturing method according to claim 16, wherein the forming the contact layer comprises:
    sequentially forming a first inorganic material layer and a second inorganic material layer on the base substrate; and
    performing patterning processing on the first inorganic material layer and the second inorganic material layer during a same mask process, so as to respectively form a first inorganic layer and a second inorganic layer, wherein the second inorganic layer is used as the contact layer and, in a dry etching process of the same mask process, a dry etching rate of the first inorganic material layer is smaller than a dry etching rate of the second inorganic material layer.

18. The manufacturing method according to claim 16, wherein the forming the contact layer comprises:
    sequentially forming a first inorganic material layer, a second inorganic material layer, and a contact-layer material layer on the base substrate; and
    performing patterning processing on the first inorganic material layer, the second inorganic material layer, and the contact-layer material layer during a same mask process, so as to respectively form a first inorganic layer, a second inorganic layer, and the contact layer,
    wherein, in a dry etching process of the same mask process, dry etching rates of the first inorganic material layer, the second inorganic material layer, and the contact-layer material layer are sequentially increased.

19. A display substrate, comprising:
    a base substrate;
    a sealant on the base substrate; and
    a contact layer between the base substrate and the sealant, the contact layer being in contact with the sealant, a contact layer surface of the contact layer away from the base substrate is non-flat at a contact position where the contact layer is in contact with the sealant,
    wherein the contact layer surface comprises at least one contact layer groove at the contact position where the contact layer is in contact with the sealant, the at least one contact layer groove comprises a plurality of first grooves and a plurality of second grooves, and the plurality of first grooves and the plurality of second grooves are different in depth, and
    wherein the plurality of first grooves and the plurality of second grooves are staggered.

20. The display substrate according to claim 19, further comprising:
    an organic layer between the base substrate and the contact layer, wherein an organic layer surface of the organic layer being away from the base substrate is non-flat at a position of the sealant, so that the contact layer surface is non-flat at the contact position.

* * * * *